(12) United States Patent
Jean et al.

(10) Patent No.: US 8,034,719 B1
(45) Date of Patent: Oct. 11, 2011

(54) METHOD OF FABRICATING HIGH ASPECT RATIO METAL STRUCTURES

(75) Inventors: Daniel L. Jean, Odenton, MD (US); Michael Deeds, Port Tobacco, MD (US); Allen Keeney, Upperco, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 994 days.

(21) Appl. No.: 11/311,584

(22) Filed: Dec. 8, 2005

(51) Int. Cl.
*H01L 21/302* (2006.01)
(52) U.S. Cl. ........ 438/700; 438/706; 438/712; 438/719; 438/723; 438/761
(58) Field of Classification Search ............ 438/700, 438/706, 712, 723, 761, 778, 787, FOR. 388, 438/FOR. 390
See application file for complete search history.

(56) References Cited

U.S. PATENT DOCUMENTS

| | | | |
|---|---|---|---|
| 6,458,615 B1 | 10/2002 | Fedder et al. | |
| 6,673,694 B2 | 1/2004 | Borenstein | |
| 6,798,200 B2* | 9/2004 | Fan ................. | 324/309 |
| 6,875,544 B1 | 4/2005 | Sweatt et al. | |
| 6,946,314 B2 | 9/2005 | Sawyer et al. | |
| 6,960,488 B2 | 11/2005 | Brosnihan et al. | |
| 2002/0176804 A1* | 11/2002 | Strand et al. ................. | 422/100 |
| 2003/0222648 A1* | 12/2003 | Fan ................. | 324/318 |
| 2004/0021005 A1* | 2/2004 | Stout et al. ................. | 239/302 |
| 2004/0196335 A1* | 10/2004 | Stout et al. ................. | 347/64 |
| 2005/0074676 A1* | 4/2005 | Watanabe et al. ................. | 430/5 |
| 2005/0153215 A1* | 7/2005 | Bornstein et al. ................. | 430/5 |
| 2005/0182307 A1* | 8/2005 | Currie et al. ................. | 600/300 |
| 2006/0055090 A1* | 3/2006 | Lee et al. ................. | 264/494 |

OTHER PUBLICATIONS

Marc J. Madou, "Fundamentals of Microfabrication: The Science of Miniaturization," CRC Press LLC, 2002, 325-377.

* cited by examiner

*Primary Examiner* — Matthew Smith
*Assistant Examiner* — Joannie A Garcia
(74) *Attorney, Agent, or Firm* — Fredric J. Zimmerman

(57) ABSTRACT

To fabricate high aspect ratio metal structures, a two-layer structure is provided on a conductive layer. The two-layer structure includes a first layer adjacent the conductive layer and a second layer adjacent the first layer where the second layer is etchable by a Deep Reactive Ion Etching (DRIE) process. Using the DRIE process, at least one selected region of the second layer is completely etched away with the selected region being at least partially aligned with a region of the conductive layer such that the first layer is then exposed thereover. The first layer so-exposed is then removed to expose the region of the conductive layer thereunder. Metal is electroplated onto the exposed conductive layer and any remaining portions of the two-layer structure are then removed.

20 Claims, 2 Drawing Sheets

METHOD OF FABRICATING HIGH ASPECT RATIO METAL STRUCTURES

ORIGIN OF THE INVENTION

The invention described herein was made in the performance of official duties by employees of the Department of the Navy and may be manufactured, used, licensed by or for the Government for any governmental purpose without payment of any royalties thereon.

FIELD OF THE INVENTION

The invention relates generally to the fabrication of small metal structures, and more particularly to a method for fabricating high aspect ratio metal structures.

BACKGROUND OF THE INVENTION

High aspect ratio metal structures are presently formed using a process known as LIGA. In the LIGA process, polymer is spun onto a metallized wafer. The polymer is selectively exposed and etched away to expose the plating base onto which metal is electroplated to create the high-aspect ratio metal structures. Finally, the polymer mold is stripped away. A disadvantage is that an x-ray synchrotron is needed to expose the polymer mold. Since only a few x-ray synchrotrons exist in the United States, the process is very expensive. In addition, these machines can only expose a small percentage of a wafer so this process does not make efficient use of the raw materials. Accordingly, Applicant has invented a novel process to solve these deficiencies, which includes a Deep Reactive Ion Etching (DRIE) process to etch an area in conjunction with electroplating the area for production of high aspect ratio metal structures.

SUMMARY OF THE INVENTION

It is an object of the present invention to provide a method of fabricating small, high aspect ratio metal structures.

Another object of the present invention is to provide a high-volume, low-cost method of fabricating small, high aspect ratio metal structures.

Other objects and advantages of the present invention will become more obvious hereinafter in the specification and drawings.

In accordance with the present invention, a method is provided for fabrication of high aspect ratio metal structures on a conductive layer. A two-layer structure on the conductive layer includes a first layer adjacent the conductive layer and a second layer adjacent the first layer. Materials used are such that the second layer is etchable by a Deep Reactive Ion Etching (DRIE) process while the first layer is not etchable. Using the DRIE process, at least one selected region of the second layer is completely etched away with the selected region being at least partially aligned with a region of the conductive layer such that the first layer is then exposed thereover. The first layer so-exposed is then removed so that the region of the conductive layer is exposed. As a result, the remaining portions of the two-layer structure combined with the region of the conductive layer define a mold including a base region defined by the region of the conductive layer. Metal is electroplated onto the base portion to a selected height. Finally, the remaining portions of the two-layer structure are removed.

BRIEF DESCRIPTION OF THE DRAWINGS

Other objects, features and advantages of the present invention will become apparent upon reference to the following description of the embodiments and to the drawings, wherein corresponding reference characters indicate corresponding parts throughout the several views of the drawings and wherein.

DETAILED DESCRIPTION OF THE INVENTION

Figure 1A:
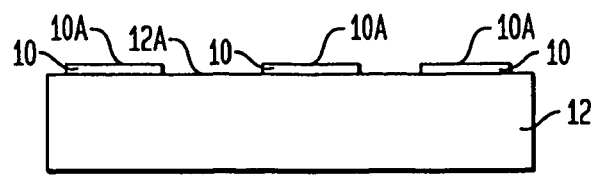
FIGS. 1A-1F depict side views of the sequential structures resulting from the fabrication process steps in accordance with one embodiment of the present invention.

Referring now to the drawings, and more particularly to FIGS. 1A-1F, the initial, intermediate and ultimate structures formed by one embodiment of the present invention's fabrication process are illustrated. In general, the process and resulting high aspect ratio metal structures are applicable to any micro-scale electronics application where precise control over a metal structure's features is required. For example, many micro electromechanical systems (MEMS) applications could utilize high aspect ratio metal structures. However, it is to be understood that the end-use application of any metal structure fabricated in accordance with the present invention is not a limitation thereof.

Referring first to FIG. 1A, one or more conductive layers 10 are deposited/bonded onto one or more locations of support 12. In an embodiment, the conductive layers 10 are in a same plane and substantially parallel to each other. In an embodiment, the conductive layer(s) 10 is/are a metal pad(s) or metal plate(s) 10. In terms of batch fabrication, one or more conductive layers 10 are deposited in a pattern on support 12, which is generally silicon or glass having a flat surface 12A. Conductive layers 10 can be any shape without departing from the scope of the present invention. Conductive layers 10 can be any electrically-conductive metal (e.g., gold, copper, chromium, titanium-tungsten, etc.) suitable for forming a base of a high-aspect ratio metal structure on an exposed surface 10A thereof that is generally flat. The methods and means chosen for depositing/bonding conductive layers 10 to support 12 are well known in the art of electronics and are not limitations of the present invention.

Figure 1B:
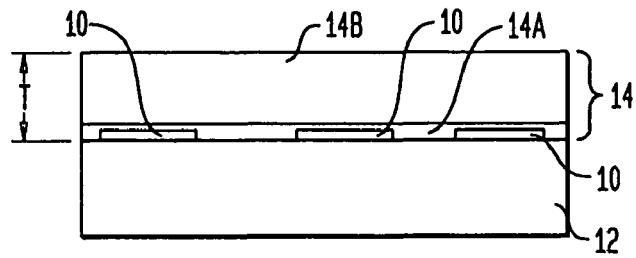

The structure of FIG. 1A has a layered structure positioned thereon as illustrated in FIG. 1B. More specifically, a two-layer material structure 14 of thickness T includes a first layer 14A residing adjacent to surfaces 10A and 12A and a second layer 14B residing adjacent to first layer 14A. For purpose of illustration, the thickness of first layer 14A and conductive layers 10 relative to the thickness of second layer 14B are exaggerated. As indicated below, in an embodiment, the first layer 14A is an adhesive material, which is used for bonding but may also function in a protective manner. In another embodiment, the first layer 14A is comprised of two sub-layers, a first sub-layer comprised of an etch stop material, for example, silicon dioxide, and a second sub-layer comprised of an adhesive material, for example, benzocyclobutene, for bonding. In another embodiment, the first layer 14A is comprised of a single material, for example, benzocyclobutene, which acts as an etch stop material and an adhesive material for bonding.

In another embodiment, the first layer 14A is comprised of a single material, for example, silicon dioxide, which may also act as an etch stop material and an adhesive material for bonding provided the conductive layer 10, for example, a metal layer, is patterned. Accordingly, the metal layer will form a strong bond with the silicon dioxide surrounding the metal layer, assuming the materials touch. This approach would require a relief cut in the first layer 14A, for example, the oxide layer, to account for a thickness of the metal layer 10. In an alternate embodiment, a relief cut is made in support 12 and the metal layer 10 is patterned into the cut so that a top surface of the support 12 is flat and easily bonds to the first layer 14A. Accordingly, the first layer 14A can touch the conductive layer 10 as long as relief cuts are made in the first layer 14A or support 12 so that the first layer 14A is bonded to the support 12 without the conductive layer 10 creating a standoff.

The structure illustrated in FIG. 1B (i.e., conductive layers 10 sandwiched between support 12 and the two-layer material structure 14 sometimes referred to as "two-layer structure" 14) can be achieved in a variety of ways without departing from the scope of the present invention. For example, two-layer structure 14 could be attached/bonded just to support 12 or to conductive layers 10 and support 12. Another possibility would be to first coat all of surface 12A with first layer 14A, etch away regions of layer 14A and bond conductive layers 10 to support 12 at these etched-away regions, and apply a fresh coating of layer 14A to the exposed portions of conductive layers 10.

For reasons that will be explained further below, first layer 14A is a material not affected, that is, etchable, by the etching beam produced by a Deep Reactive Ion Etching (DRIE) process. In contrast, second layer 14B is a material that will be affected, that is, etchable, by the etching ions of a DRIE process. Details of the DRIE process are well known and are explained by M. Madau in "Fundamentals of Microfabrication," Second Edition, CRC Press, 2002, Chapter 2, the contents of which are hereby incorporated by reference. One material construction suitable for layered structure 14 is silicon dioxide for first layer 14A and silicon for second layer 14B.

Figure 1C:
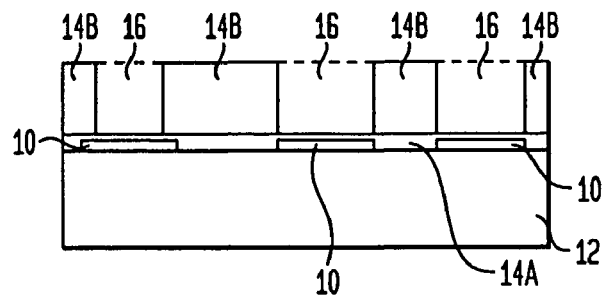

The structure of FIG. 1B is next subjected to a DRIE process with a resulting structure being illustrated in FIG. 1C. Specifically, regions of second layer 14B are etched away by the DRIE process such that each of the resulting etched regions 16 (FIG. 1C) is partially or completed aligned with at least one of the conductive layers 10. Methods used to align etched regions 16 with conductive layers 10 are well known in the art. In an embodiment, at least one of the conductive layers 10 includes a flat surface substantially adjacent the first layer 14A of at least one of the etched regions 16.

Figure 1D:
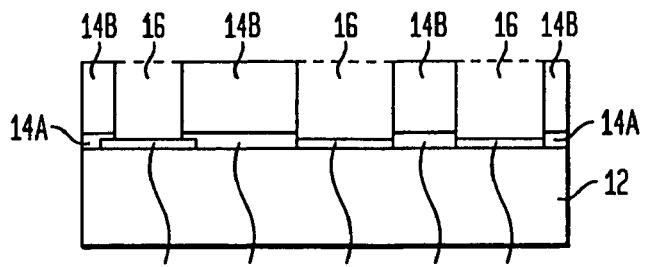

As a result of the DRIE etching process performed at regions 16, first layer 14A is exposed at each of regions 16 over corresponding portions of conductive layers 10. In an embodiment, the first layer 14A includes an exposed surface substantially adjacent at least one of the regions 16. Since first layer 14A is a material that cannot be etched by the DRIE process, first layer 14A in regions 16 protects the DRIE processing equipment during the ion beam etching process. However, the exposed portions of first layer 14A regions 16 must be removed following the DRIE process. One way to do this is to apply a solvent (e.g., an acid) to the exposed portions of first layer 14A that has little or no affect on second layer 14B owing to the choice of solvent, time of exposure, and/or the relative thickness differences between layers 14A and 14B. For example, if first layer 14A is silicon dioxide and second layer 14B is silicon, the solvent could be hydrofluoric acid. The resulting structure is illustrated in FIG. 1D where the remaining portions of the two-layer structure 14 combined with the now-exposed regions of conductive layers 10 form a mold.

Figure 1E:
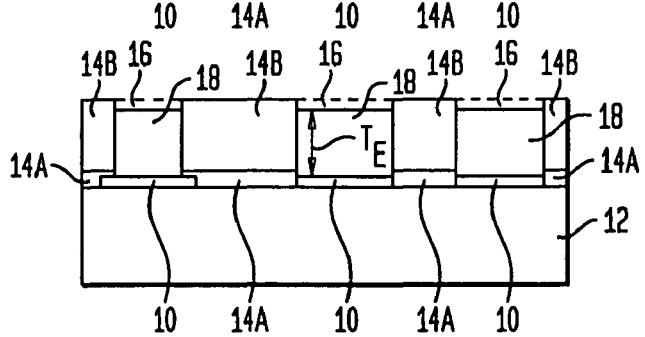

Referring now to FIG. 1E, the mold structure (illustrated in FIG. 1D) is subjected to an electroplating process during which metal 18 is electroplated onto the portions of conductive layers 10 exposed in regions 16. Metal 18 can be the same metal or a different metal used for conductive layers 10. The thickness $T_E$ of electroplated metal 18 can range up to or beyond the thickness T of two-layer structure 14, with a final leveling/sanding process generally being applied when the thickness of metal 18 is greater than thickness T.

Figure 1F:
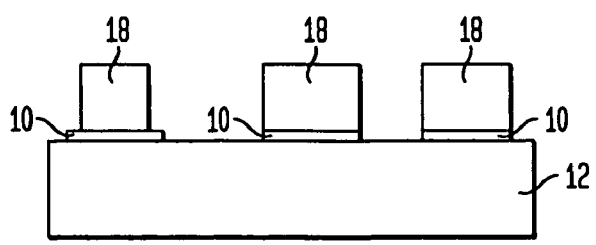

The final step in the process involves removing the remaining portions of the two-layer structure 14 (illustrated in FIGS. 1D and 1E) that form a portion of the mold for electroplated metal 18. While this can be accomplished in a variety of ways, including selective etching or bonding, care should be taken in order to retain the structural integrity of support 12 and the high aspect ratio metal structures defined by electroplated metal 18. One way to achieve this removal is to break down or dissolve each portion of first layer 14A illustrated in FIGS. 1D and 1E. For example, second layer 14B could be removed using a first solvent and then first layer 14A could be removed using a second solvent. Another possibility is to apply an acid (e.g., hydrofluoric acid when the first layer 14A is silicon dioxide) to the portions of the first layer 14A until the remaining portions of the second layer 14B are released. Any remaining traces of first layer 14A could then be washed off so that the ultimate structure appears as illustrated in FIG. 1F where the high aspect ratio metal structures are electroplated metal 18. As used herein, the term "high aspect ratio" generally refers to structures including a thickness (or height) to width ratio of 3:1 or greater.

The structure illustrated in FIG. 1F generally undergoes further processing depending on the ultimate application of metal structures 18. For example, conductive layers 10 and support 12 could be removed leaving just individual metal structures 18. Another possibility is that a portion of conductive layer 10 and/or support 12 is released or etched away so that a portion of metal structure 18 can move as would be the case of a micro-electromechanical systems (MEMS) device.

Figure 2A:
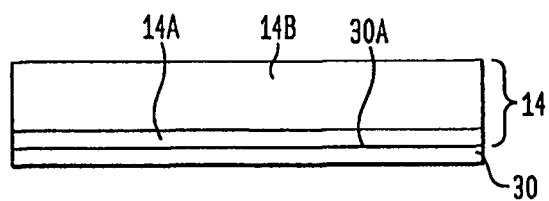
FIGS. 2A-2E depict side views of the sequential structures resulting from the fabrication process steps in accordance with another embodiment of the present invention.

The present invention is not limited to the ultimate structure illustrated in FIG. 1F. For example, the fabrication process of the present invention could also be accomplished without the use of support 12 as will now be explained with the aid of FIGS. 2A-2E where like reference numerals will be used for those elements that have been described previously. In FIG. 2A, a continuous conductive layer or backplane 30 includes a flat surface 30A. A two-layer structure 14 is bonded to the flat surface 30A thereof. In an embodiment, the continuous conductive layer or backplane 30 is a metal backplane 30. Similar to the previously-described embodiment, the two-layer structure 14 includes a first layer 14A (e.g., silicon dioxide) adjacent the backplane 30, and a second layer 14B (e.g., silicon) adjacent the first layer 14A. Accordingly, the first layer 14A is adjacent as well as contacts the flat surface 30A.

Figure 2B:
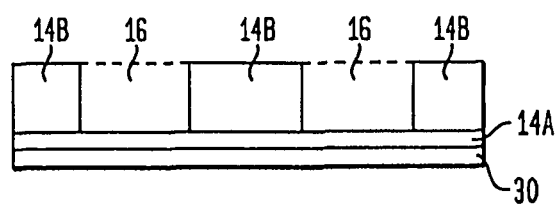
Figure 2C:
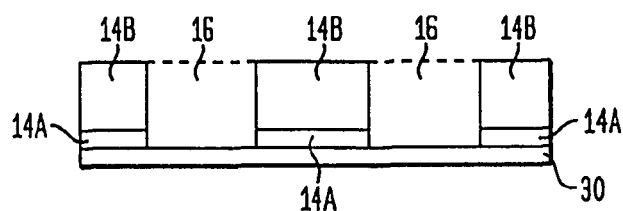
Figure 2D:
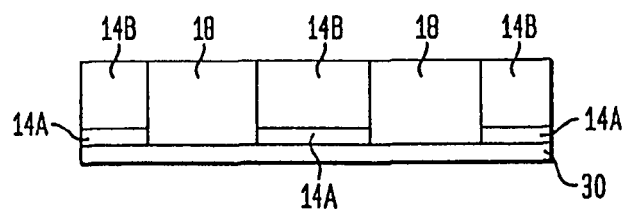
Figure 2E:
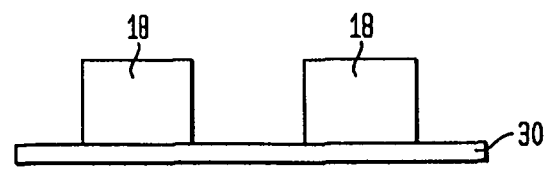

In FIG. 2B, a DRIE process etches away portions of second layer 14B at selected regions 16 with each of etched regions 16 aligned over the backplane 30. The size and lateral shaping of each region 16 can be tailored to the required size and lateral dimensions of the ultimately formed high aspect ratio metal structures. The resulting exposed portions of the first layer 14A in etched regions 16 are removed in substantially the same way as in the previously-described embodiment to yield a structure shown in FIG. 2C where the backplane 30 is exposed at etched regions 16. In an embodiment, etched regions 16 are separated by one or more two-layer structures 14. Thus, the structure in FIG. 2C defines the mold for the electroplating of a metal 18 onto exposed areas of the backplane 30 as illustrated in FIG. 2D. After the electroplating process is complete, the remaining portions of two-layer structure 14 illustrated in FIG. 2D are removed yielding the structure shown in FIG. 2E where only high aspect ratio metal structures (electroplated metal) 18 remain on metal backplane 30. For emphasis, the term "high aspect ratio" generally refers to structures including a thickness (or height) to width ratio of 3:1 or greater.

The advantages of the present invention are numerous. A simple method of fabricating high aspect ratio metal structures is made possible given that DRIE processing equipment exists in hundreds of commercial, educational and government facilities. In addition, the present invention lends itself to large-scale batch processing as compared to the current LIGA process. The present invention will find great utility in a variety of microelectronics applications from micro-explosives to NEMS devices.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

Finally, any numerical parameters set forth in the specification and attached claims are approximations (for example, by using the term "about") that may vary depending upon the desired properties sought to be obtained by the present invention. At the very least, and not as an attempt to limit the application of the doctrine of equivalents to the scope of the claims, each numerical parameter should at least be construed in light of the number of significant digits and by applying ordinary rounding.

What is claimed is:

1. A method of fabricating metal structures, comprising:
   providing a two-layer structure of selected thickness on at least one: conductive layer, said two-layer structure comprises a first layer adjacent said at least one conductive layer and a second layer adjacent said first layer;
   etching, using a Deep Reactive Ion Etching (DRIE) process, completely through at least one selected etchable region of said second layer with said at least one selected etchable region being at least partially aligned with a region of said at least one conductive layer;
   removing said first layer for exposing said region of said at least one conductive layer,
      wherein remaining portions of said two-layer structure and said region of said at least one conductive layer so-exposed define a mold, said mold comprises a base region;
   electroplating a metal onto said base region; and
   removing said remaining portions of said two-layer structure for forming a metal structure,
      wherein said at least one conductive layer comprises a plurality of conductive layers deposited in a pattern on a support substrate,
      wherein said first layer is comprised of silicon dioxide and said second layer is comprised of silicon,
      wherein said etching said at least one selected etchable region forms a trench in said silicon of said second layer, and
      wherein said electroplating includes filling said trench with said metal.

2. The method according to claim 1, wherein said support substrate is an electrically non-conductive substrate.

3. The method according to claim 1, wherein said removing is comprised of acid applied to said first layer so-exposed thereto.

4. The method according to claim 1, wherein said at least one conductive layer and said metal electroplated onto said base region are both comprised of a same material.

5. The method according to claim 1, wherein said at least one conductive layer and said metal electroplated onto said base region are each comprised of different metals.

6. The method according to claim 1, wherein said removing said remaining portions of said two-layer structure is comprised of dissolving at least one of said first layer and said second layer associated with said remaining portions of said two-layer structure.

7. The method according to claim 1, wherein said first layer is comprised of a material, which is not etchable by said DRIE process.

8. The method according to claim 1, wherein said second layer is comprised of a material etchable by said DRIE process.

9. The method according to claim 1, wherein said first layer is an exposed layer resulting from said etching.

10. The method according to claim 1, wherein said first layer is exposed over said region of said at least one conductive layer.

11. The method according to claim 1, further comprising sandwiching said at least one conductive layer between said two-layer structure and the support substrate.

12. The method according to claim 11, wherein said support substrate is extended laterally beyond a periphery of said at least one conductive layer, and
    wherein said sandwiching includes said two-layer structure is bonded to said support substrate beyond said periphery.

13. The method according to claim 11, further comprising removing at least one of a portion of said at least one conductive layer and a portion of said support substrate.

14. The method according to claim 1, wherein said at least one conductive layer comprises a flat surface substantially adjacent said first layer.

15. The method according to claim 1, wherein said at least one conductive layer comprises a plurality of conductive layers deposited in a pattern on a flat support substrate.

16. A method of fabricating metal structures, comprising:
    providing a two-layer structure of selected thickness on a conductive layer, said two-layer structure comprises a first layer adjacent said conductive layer and a second layer adjacent said first layer;
    etching, using a Deep Reactive Ion Etching (DRIE) process, completely through at least one selected etchable region of said second layer with said at least one selected etchable region being aligned with a region of said conductive layer,
       wherein said first layer is exposed over said region of said conductive layer; removing said first layer for exposing said region of said conductive layer,
       wherein remaining portions of said two-layer structure and said region of conductive layer so-exposed define a mold, said mold comprises a base region;
    electroplating a metal onto said base region; and
    removing said remaining portions of said two-layer structure for forming a metal structure,
       wherein said two-layer structure includes a first thickness,
       wherein said metal is electroplated so said metal structure comprises a second thickness at least as thick as the first thickness,
       wherein said first layer is comprised of silicon dioxide and said second layer is comprised of silicon, wherein said etching said at least one selected etchable region forms a trench in said silicon of said second layer, and wherein said electroplating includes filling said trench with said metal.

17. The method according to claim 16, wherein said conductive layer is a metal backplane.

18. The method according to claim 16, wherein said removing is comprised of an acid applied to said first layer.

19. The method according to claim 16, wherein said conductive layer and said metal electroplated onto said base region are each comprised of different materials.

20. The method according to claim 16, wherein said metal structure is a high aspect ratio metal structure.

* * * * *